(12) United States Patent
Iguchi

(10) Patent No.: US 8,831,822 B2
(45) Date of Patent: Sep. 9, 2014

(54) BATTERY MANAGEMENT SYSTEM AND BATTERY REPLACEMENT METHOD

(71) Applicant: Hiroki Iguchi, Nagoya (JP)

(72) Inventor: Hiroki Iguchi, Nagoya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/940,801

(22) Filed: Jul. 12, 2013

(65) Prior Publication Data

US 2014/0046536 A1 Feb. 13, 2014

(30) Foreign Application Priority Data

Aug. 7, 2012 (JP) ................................. 2012-175094

(51) Int. Cl.
*G06F 11/30* (2006.01)
*B60L 11/18* (2006.01)
*G01R 31/36* (2006.01)
*H01M 10/42* (2006.01)

(52) U.S. Cl.
CPC ... *G01R 31/3606* (2013.01); *H01M 2010/4271* (2013.01); *B60L 11/18* (2013.01); *H01M 2220/20* (2013.01); *H01M 10/42* (2013.01)
USPC ...................................................... 701/34.4

(58) Field of Classification Search
CPC .. G07C 5/0808; Y02T 90/30; G01R 31/3606; H01M 10/42; B60L 11/18
USPC .............. 701/24, 34.4, 36; 104/34; 180/65.1; 320/109, 121; 307/9.1, 10.1; 702/63
See application file for complete search history.

(56) References Cited

U.S. PATENT DOCUMENTS

| 2003/0209375 A1* | 11/2003 | Suzuki et al. ................. 180/65.3 |
| 2008/0281732 A1* | 11/2008 | Yamada .......................... 705/30 |
| 2009/0218987 A1* | 9/2009 | Tominaga ..................... 320/134 |
| 2011/0301789 A1* | 12/2011 | Sung .............................. 701/22 |
| 2013/0085696 A1* | 4/2013 | Xu et al. .......................... 702/63 |
| 2013/0264996 A1* | 10/2013 | Soong et al. .................. 320/106 |

FOREIGN PATENT DOCUMENTS

JP 2004303702 A * 10/2004
JP A-2006-228490 8/2006

* cited by examiner

*Primary Examiner* — Mary Cheung
*Assistant Examiner* — Rodney Butler
(74) *Attorney, Agent, or Firm* — Oliff PLC

(57) ABSTRACT

A battery management system includes: measuring a surface pressure of a vehicle-mounted secondary battery (battery cell) for driving the vehicle with a lapse of time; calculating a high-rate driving frequency coefficient on the basis of the measured surface pressure at intervals of a predetermined period (24 hours); deriving a high-rate driving frequency on the basis of the number of times that the calculated high-rate driving frequency coefficient has exceeded a predetermined threshold; and selecting a replacement battery from among batteries including a high-power battery on the basis of the derived high-rate driving frequency.

12 Claims, 10 Drawing Sheets

BATTERY MANAGEMENT SYSTEM AND BATTERY REPLACEMENT METHOD

INCORPORATION BY REFERENCE

The disclosure of Japanese Patent Application No. 2012-175094 filed on Aug. 7, 2012 including the specification, drawings and abstract is incorporated herein by reference in its entirety.

BACKGROUND OF THE INVENTION

1. Field of the Invention

The invention relates to a battery management system and battery replacement method for replacing a vehicle-mounted battery with a battery that is right for a user.

2. Description of Related Art

A secondary battery, such as a lithium ion secondary battery, is mounted on a vehicle, such as a hybrid vehicle and an electric vehicle, and is used to drive the vehicle. The vehicle-mounted secondary battery may need to be replaced due to degradation based on usage, failure, or the like. In such a case, the battery before replacement is recovered for reuse.

A known technique for reusing a battery is, for example, the technique described in Japanese Patent Application Publication No. 2006-228490 (JP 2006-228490 A). In the technique described in JP 2006-228490 A, the operation history information of an in-vehicle battery is stored in a noncontact random access RFID tag in advance, and, at the time when the in-vehicle battery has been recovered, the operation history information is read from the RFID tag. Then, it is determined whether the in-vehicle battery is reusable on the basis of the read operation history information.

SUMMARY OF THE INVENTION

The technique described in JP 2006-228490 A just determines whether the recovered battery is reusable, and does not use the operation history information (usage history) of the recovered battery in selecting a replacement battery. A degradation mode of a secondary battery depends on how the secondary battery is used. Therefore, if it is possible to acquire how a secondary battery is used, which is specific to a user, on the basis of the usage history of the secondary battery before replacement and then to use it in selecting a replacement battery, it is possible to select a battery that is right for the user as a replacement battery.

Particularly, such selection of a replacement battery is important for a user who frequently performs high-rate driving. This is because, in the case of the user who frequently performs high-rate driving, it is important to replace the battery with a high-power battery that allows such a way of usage in order to suppress degradation of the battery. High-rate driving means driving in a state where the output power of a battery is higher than or equal to a certain value, such as driving at a high speed over a long period of time. When a vehicle that uses a motor as a drive source is driven at a high speed over a long period of time, it is required to keep the high power of the motor. Therefore, the secondary battery is required to discharge a large current, and the output power needs to be higher than or equal to a certain value. In the secondary battery, discharging a large current causes degradation of the battery, such as an increase in resistance increasing rate. Thus, in the case of the user who frequently performs high-rate driving, it is important to replace the battery with a high-power battery.

The invention makes it possible to provide a battery that is right for a user by obtaining a high-rate driving frequency on the basis of how a vehicle-mounted secondary battery is used and then utilizing the high-rate driving frequency in selecting a replacement battery.

An aspect of the invention provides a battery management system. The battery management system includes: a measuring unit configured to measure a surface pressure of a vehicle-mounted secondary battery for driving the vehicle with a lapse of time; a calculation unit configured to calculate a high-rate driving frequency coefficient at intervals of a predetermined period on the basis of the surface pressure measured by the measuring unit, the high-rate driving frequency coefficient being an index of a frequency of high-rate driving; a deriving unit configured to derive a high-rate driving frequency on the basis of the number of times that the high-rate driving frequency coefficient calculated by the calculation unit has exceeded a predetermined threshold; and a selecting unit configured to select a replacement battery from among batteries including a high-power battery on the basis of the high-rate driving frequency derived by the deriving unit.

According to the aspect of the invention, the replacement battery is selected on the basis of the high-rate driving frequency at the time of replacement of the battery. Therefore, when a user frequently performs high-rate driving, the battery just needs to be replaced with a high-power battery suitable for such usage. In this way, according to the aspect of the invention, it is possible to provide a battery right for a user.

In the battery management system according to the aspect of the invention, the calculation unit may be configured to calculate the high-rate driving frequency coefficient by $$c = \sum_{n=1}^{A} \Delta B_n$$

at the intervals of the predetermined period where A is the number of times the surface pressure has increased at the time of discharging the secondary battery, $\Delta B_n$ (n=1, 2, ..., A) is a surface pressure increase amount at each increase in surface pressure and C is the high-rate driving frequency coefficient. With this configuration, it is possible to reliably determine the degree, to which high-rate driving is performed in a certain period, on the basis of the high-rate driving frequency coefficient C.

In the battery management system according to the aspect of the invention, the predetermined period may be 24 hours. With this configuration, the calculated high-rate driving frequency coefficient C indicates the degree of high-rate driving per day, so it is possible to further determine a difference in how the vehicle is used between a weekday and a day off.

In the battery management system according to the aspect of the invention, the deriving unit may be configured to determine that the high-rate driving frequency is high when the number of times that the high-rate driving frequency coefficient calculated after predetermined time has exceeded the threshold is larger than or equal to a predetermined number of times, and the deriving unit may be configured to determine that the high-rate driving frequency is low when the number of times that the high-rate driving frequency coefficient calculated after the predetermined time has exceeded the threshold is smaller than the predetermined number of times. With this configuration, even when the calculated high-rate driving frequency coefficient frequently exceeds the threshold before the predetermined time but when the number of times the high-rate driving frequency coefficient exceeds the threshold becomes small after the predetermined time, it is not determined that the high-rate driving frequency is high. Thus, when how the vehicle is used has changed, for example, when the user of the vehicle has changed, it is possible to derive an accurate high-rate driving frequency based on only how the vehicle is currently used by setting the date of the change as the predetermined time.

The battery management system according to the aspect of the invention may further include an input unit configured to allow input of information as to whether a user places importance on acceleration and information as to whether the user places importance on electric vehicle range that the vehicle travels only using a power of a motor, wherein the selecting unit may be configured to select the high-power battery as the replacement battery when the deriving unit has determined that the high-rate driving frequency is high and when information that the user places importance on acceleration has been input by the input unit, and the selecting unit may be configured to select a high-capacity battery as the replacement battery when the deriving unit has determined that the high-rate driving frequency is high or low and when information that the user places importance on the electric vehicle range has been input by the input unit. With this configuration, the replacement battery is selected in consideration of not only the high-rate driving frequency but also whether the user places importance on acceleration and whether the user places importance on the electric vehicle range, so it is possible to provide the replacement battery that further matches with user's need.

The battery management system according to the aspect of the invention may further include an output control unit configured to execute output control over the secondary battery such that an output of the secondary battery is lower than a predetermined output control threshold, wherein the output control unit may be configured to increase the output control threshold with respect to a reference value when the selecting unit has selected the high-power battery as the replacement battery, and the output control unit may be configured to reduce the output control threshold with respect to the reference value when the selecting unit has selected the high-capacity battery as the replacement battery. With this configuration, when the high-power battery has been selected as the replacement battery, the output control threshold is increased, so output control over the battery is hard to be activated. Thus, acceleration performance, or the like, improves, and drivability (easiness of driving) improves. In addition, fuel economy during high-rate driving also improves. On the other hand, when the high-capacity battery has been selected as the replacement battery, the output control threshold is reduced, so output control over the battery is easily activated. Thus, it is possible to appropriately prevent degradation of the battery by suppressing high-rate driving.

Another aspect of the invention relates to a battery replacement method of selecting a replacement battery on the basis of a high-rate driving frequency of a vehicle-mounted secondary battery by sequentially performing processes that are executed by the above-described battery management system. The battery replacement method includes; measuring a surface pressure of a vehicle-mounted secondary battery for driving the vehicle with a lapse of time; calculating a high-rate driving frequency coefficient at intervals of a predetermined period on the basis of the measured surface pressure, the high-rate driving frequency coefficient being an index of a frequency of high-rate driving; deriving a high-rate driving frequency on the basis of the number of times that the calculated high-rate driving frequency coefficient has exceeded a predetermined threshold; and selecting a replacement battery from among batteries including a high-power battery on the basis of the derived high-rate driving frequency.

According to the aspects of the invention, it is possible to provide a battery right for a user by selecting a replacement battery on the basis of a high-rate driving frequency that is obtained on the basis of how a vehicle-mounted secondary battery is used.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, an example embodiment of the invention will be described in detail with reference to the accompanying drawings. The embodiment implements the invention as a management system and replacement method for a vehicle-mounted battery pack.

1. Configuration of Battery Pack

Figure 1:
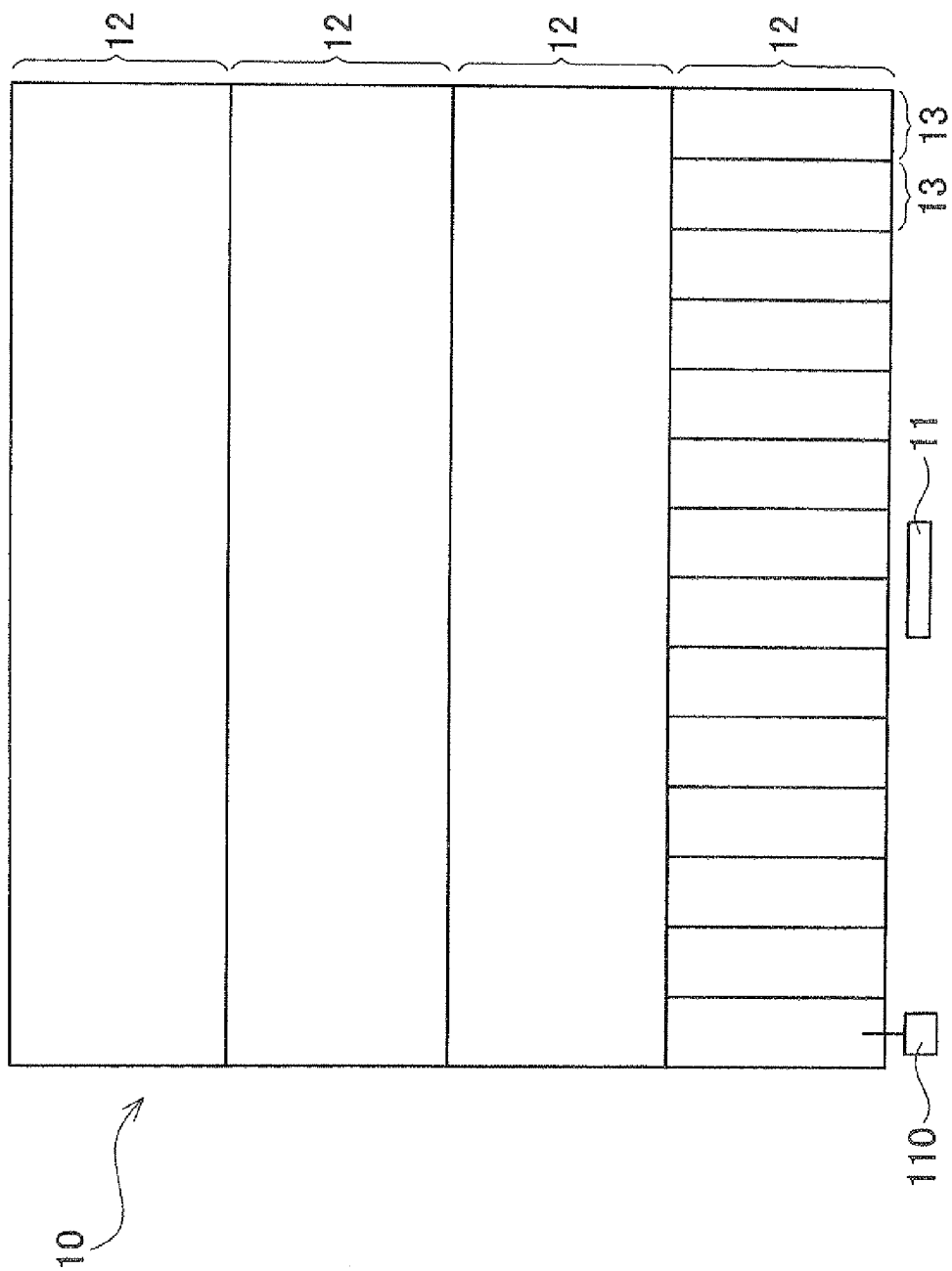
FIG. 1 is a schematic configuration view for illustrating a battery pack according to an embodiment.

As shown in FIG. 1, a battery pack 10 mounted on a vehicle in the present embodiment is a battery pack that includes a plurality of stacks 12. FIG. 1 shows the battery pack 10 that includes the four stacks 12. Each of the stacks 12 includes a plurality of battery cells 13. The stacks 12 are component batteries that constitute the battery pack 10. The lower row of FIG. 1 shows the stack 12 in which the fourteen battery cells 13 are tied together. In FIG. 1, the battery cells 13 of each of the three upper-row stacks 12 are not shown. Actually, each of the three upper-row stacks 12 is similar to the lower-row stack 12. Each of the battery cells 13 is, for example, a square lithium ion secondary battery. These are only illustrative, and the number of the stacks 12 of the battery pack 10 and the number of the battery cells 13 of each stack 12 may be any multiple number other than the above-described number. Hereinafter, in the specification, the battery pack 10, the stacks 12, and the battery cells 13 may also be simply referred to as "battery".

The battery pack 10 has a tag 11. The tag 11 is an identification information storage unit in which identification information, such as the serial number of the battery pack 10, the serial number of each of the stacks 12 and the serial number of each of the battery cells 13, is stored.

A surface pressure sensor 110 (which corresponds to a measuring unit 110 (described later)) is attached to the battery cell 13 arranged at a location at which the temperature is hard to rise the most among all the battery cells 13 that constitute the battery pack 10. Which battery cell 13 is the battery cell 13 arranged at the location at which the temperature is hard to rise the most is, for example, identified as follows. That is, an average temperature is obtained by measuring a temperature variation of each battery cell 13 with a lapse of time, and the battery cell 13 of which the average temperature is the lowest is determined.

Here, the reason why the surface pressure sensor 110 (measuring unit 110) is attached to the battery cell 13 of which the average temperature is the lowest is as follows. That is, high-rate degradation of a battery more easily advances as the temperature of the battery becomes lower. Therefore, in a battery having a lower temperature, a variation in surface pressure during high-rate driving more remarkably appears. This is because attaching the surface pressure sensor to the battery cell 13 in which a variation in surface pressure appears most remarkably is effective in measuring the frequency of high-rate driving. It is presumable that a variation in the surface pressure of each battery cell 13 during high-rate driving is due to a situation that an electrolytic solution having a high salt concentration is pushed out from an electrode element accommodated in a battery case that constitutes the battery cell 13. When the electrolytic solution is pushed out, the internal resistance value of the battery cell 13 rises, and the battery cell 13 is placed in a degraded state where the electrical performance is low.

The location at which the surface pressure sensor 110 is attached is the side face of the battery case of the battery cell 13. For the above-described reason, the internal pressure of the battery case at the time of discharging the battery cell 13 rises during high-rate driving. Whether high-rate driving is performed and the degree of high-rate driving are determined by measuring a pressure that acts on the side face of the battery case with the use of the surface pressure sensor 110.

2. Configuration of Battery Management System

Figure 2:
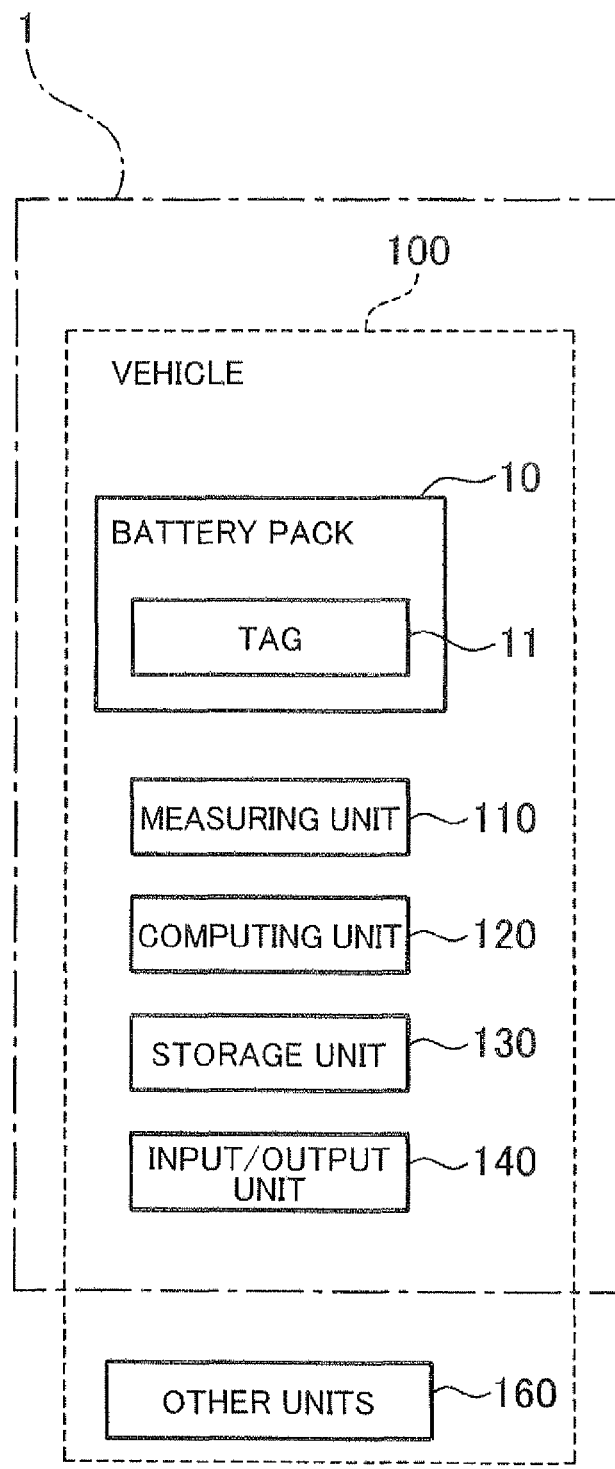
FIG. 2 is a block diagram for illustrating a battery management system according to the embodiment.

FIG. 2 shows a block diagram of a battery management system according to the present embodiment. The battery management system 1 according to the present embodiment includes a vehicle 100.

The vehicle 100 includes the battery pack 10, the measuring unit 110, a computing unit 120, a storage unit 130 and an input/output unit 140. The vehicle 100 includes a power source, such as a motor, that operates on electric power from the battery pack 10. That is, the vehicle 100 is a hybrid vehicle, an electric vehicle, or the like, on which the battery pack 10 is mounted. The other units 160 include the power source, a drive system, an operating system, and the like. The other units 160 do not constitute the battery management system 1. The battery pack 10 has the above-described tag 11.

The measuring unit 110 is the surface pressure sensor for measuring the surface pressure of the battery cell 13. The surface pressure sensor 110 is, for example, a piezoelectric surface pressure sensor.

The computing unit 120 includes a CPU. The computing unit 120 executes a process shown in the flowchart of FIG. 3.

The storage unit 130 is formed of a RAM and a ROM that are additionally provided in the CPU that constitutes the computing unit 120. The storage unit 130 stores a measured surface pressure measured by the measuring unit 110 together with a measured date and time. The storage unit 130 stores values (such as a high-rate driving frequency coefficient C) that are calculated in the process shown in FIG. 3 (described later) together with a measured date and time. Of course, the storage unit 130 may further store other data.

The input/output unit 140 is, for example, formed of a touch panel that combines a liquid crystal display device with a touch sensor. A user, or the like, of the vehicle 100 operates the touch panel to input information to the vehicle 100. Information processed by the computing unit 120 is displayed on the liquid crystal display device that constitutes the touch panel, and is output toward the user, or the like, of the vehicle 100.

3. Operation of Battery Management System

Next, the process that is executed by the computing unit 120 of the vehicle 100 that constitutes the battery management system 1 will be described. The computing unit 120 executes the process shown in FIG. 3 in order to select which battery is suitable as a replacement battery.

Figure 3:
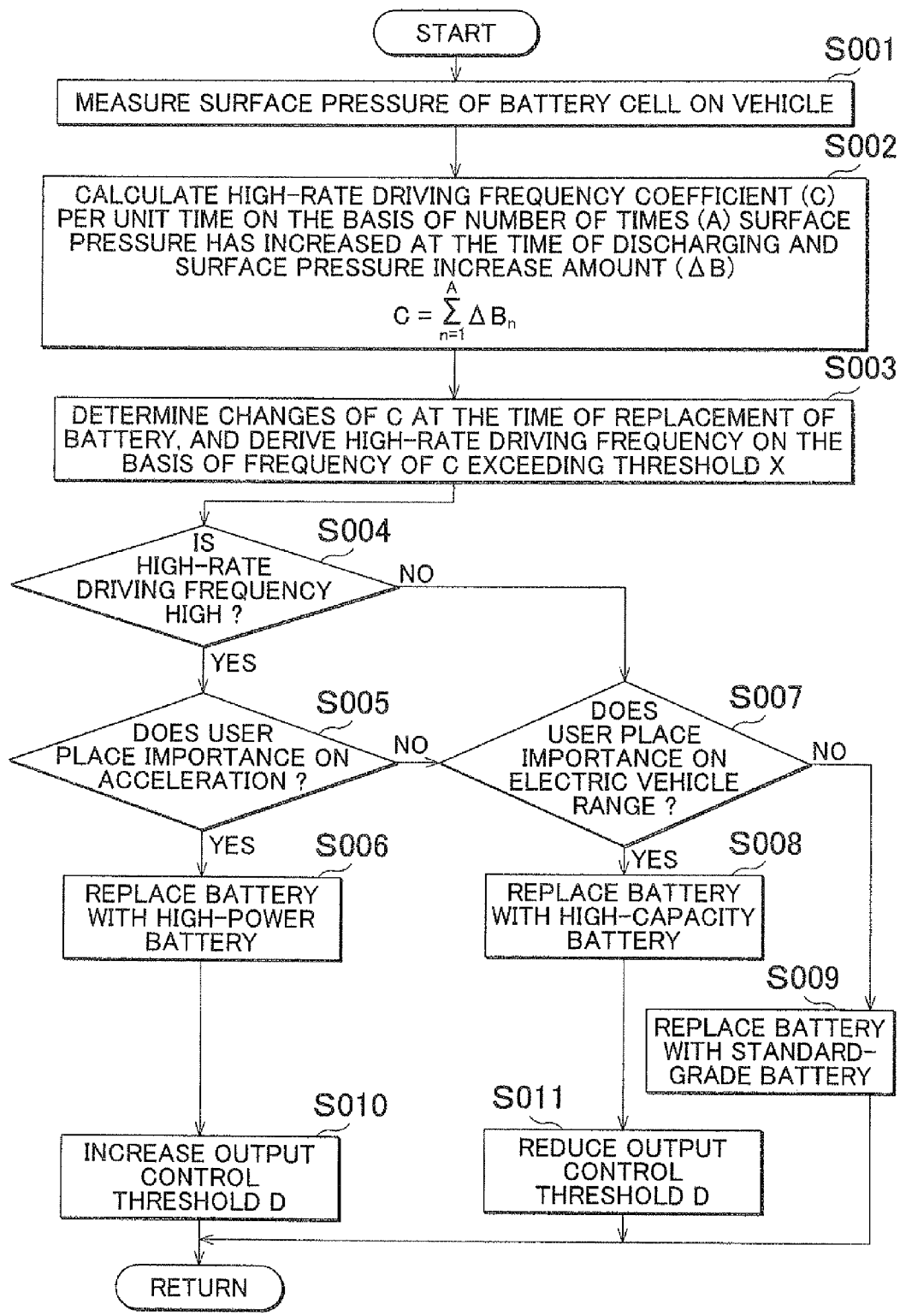
FIG. 3 is a flowchart for illustrating a process that is executed by a vehicle that constitutes the battery management system.

In the process shown in FIG. 3, the computing unit 120 initially measures the surface pressure of the battery cell 13 at predetermined time intervals (extremely short time intervals) with the use of the measuring unit 110 (step S001). Subsequently, the computing unit 120 calculates the number of times A the surface pressure has increased at the time of discharging the battery and a surface pressure increase amount ΔB in each increase in surface pressure on the basis of the history of measured surface pressures at intervals of a predetermined period of time. The intervals of the predetermined period of time is 24 hours (one day) in the embodiment. The high-rate driving frequency coefficient C per the predetermined period of time (also called per unit time) is obtained by the following mathematical expression (1) using the number of times A the surface pressure has increased at each interval of the predetermined period of time and the corresponding surface pressure increase amount ΔB (S002).

$$c = \sum_{n=1}^{A} \Delta B_n \tag{1}$$

Figure 4:
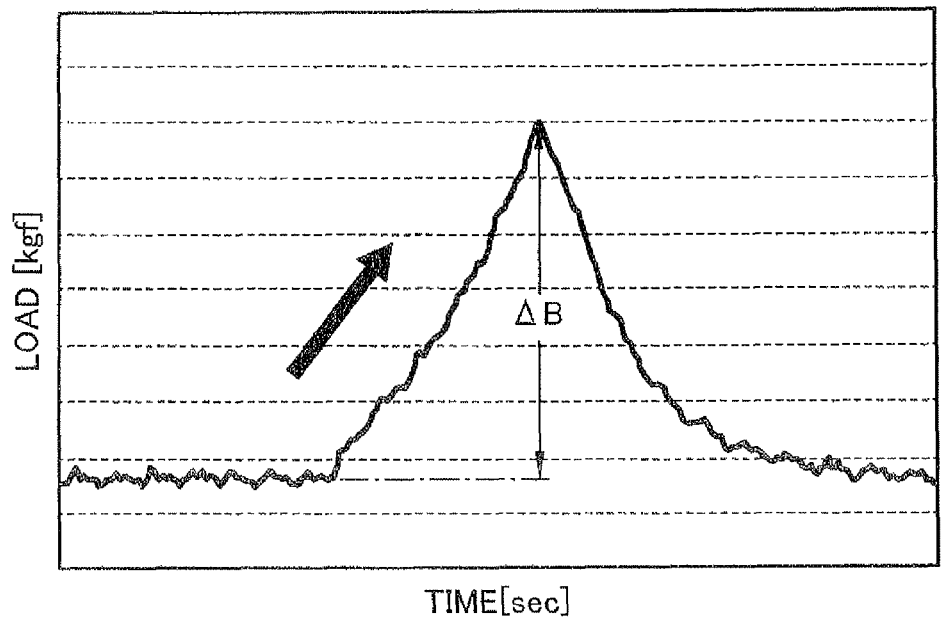
FIG. 4 is a graph that shows a variation in the surface pressure of a battery during high-rate driving.
Figure 5:
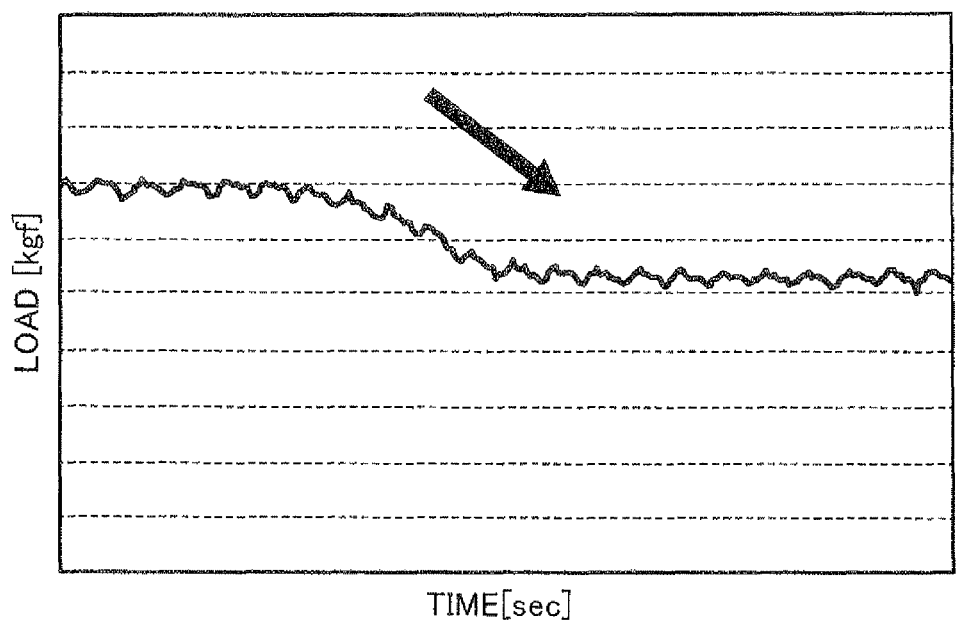
FIG. 5 is a graph that shows a variation in the surface pressure of the battery during normal driving.

As shown in FIG. 4, it is known that, during high-rate driving, the surface pressure of the battery increases through discharging. ΔB in FIG. 4 indicates the surface pressure increase amount through discharging. On the other hand, it is known that, during non-high-rate driving, the surface pressure of the battery decreases through discharging as shown in FIG. 5. Thus, by calculating the sum of the surface pressure increase amounts ΔB per unit time on the basis of the number of times A the surface pressure has increased at the time of discharging per unit time and the corresponding surface pressure increase amounts ΔB, it is possible to calculate the high-rate driving frequency coefficient C per unit time, which is an index of the frequency of high-rate driving. The high-rate driving frequency coefficient C that is calculated per unit time in this way is sequentially stored in the storage unit 130.

Here, calculation of the high-rate driving frequency coefficient C will be more specifically described. For example, when the computing unit 120 has counted 50 times an increase in surface pressure at the time of discharging in the unit time (24 hours), the high-rate driving frequency coefficient C per unit time at each increase in surface pressure is calculated by the following mathematical expression (2).

$$C = \Delta B_1 + \Delta B_2 + \Delta B_3 + \ldots + \Delta B_{50} \quad (2)$$

The computing unit 120 of the vehicle 100 constantly executes the above processes shown in step S001 and step S002. At the time of replacing the battery, the computing unit 120 checks changes of C with a lapse of time, which have been stored in the storage unit 130 till then, and derives a high-rate driving frequency (S003). Information indicating that it is time to replace the battery is input by operating the input/output unit 140. As the computing unit 120 receives the information indicating that it is time to replace the battery, the values of C stored in the storage unit 130 are loaded, and changes of C with a lapse of time are checked. The high-rate driving frequency is derived by comparing each value of C with a high-rate driving frequency coefficient threshold X.

Figure 6:
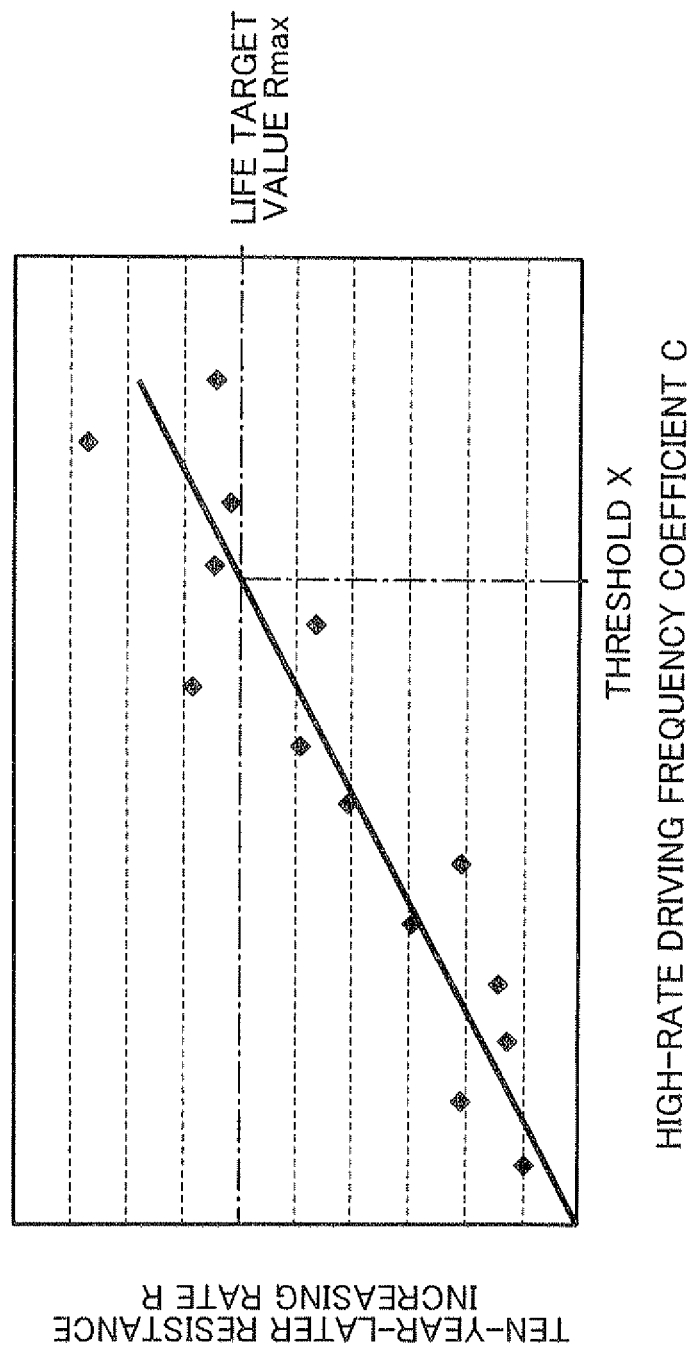
FIG. 6 is a graph for illustrating a method of setting a threshold X, and is a graph that shows the correlation between a high-rate driving frequency coefficient C and a resistance increasing rate R.

Here, the threshold X is a value preset on the basis of results of benchmark test for evaluating the performance of each battery cell 13. The value of the threshold X is stored in the storage unit 130. Specifically, the threshold X is set as follows. That is, in the benchmark test for the battery cell 13, the high-rate driving frequency coefficient C per unit time is assumed as various values, and a resistance increasing rate R of a ten-year-later battery in the case where the vehicle has been used for 10 years at each high-rate driving frequency coefficient C is estimated. There is a correlation between the high-rate driving frequency coefficient C and the ten-year-later resistance increasing rate R, and the correlation can be approximated by a straight line as shown in the graph of FIG. 6. The resistance increasing rate R is an index for determining the degree of degradation of the battery. In the resistance increasing rate R, a value that is a guide indicating that the battery has reached the end of its life is a life target value $R_{max}$. In the graph that shows a C-R characteristic shown in FIG. 6, the high-rate driving frequency coefficient C corresponding to the life target value $R_{max}$ is set as the threshold X.

In step S003, as a result of sequentially comparing each high-rate driving frequency coefficient C per unit time with the threshold X, when the number of times the high-rate driving frequency coefficient C is larger than X is larger than or equal to a predetermined number of times (ten times in the embodiment) after predetermined time T, the computing unit 120 determines that the high-rate driving frequency is high. On the other hand, when the number of times the high-rate driving frequency coefficient C is larger than X (hereinafter, also referred to as the number of times of excessive C") is smaller than the predetermined number of times (ten times in the embodiment) after the predetermined time T, the computing unit 120 determines that the high-rate driving frequency is not high.

Figure 7:
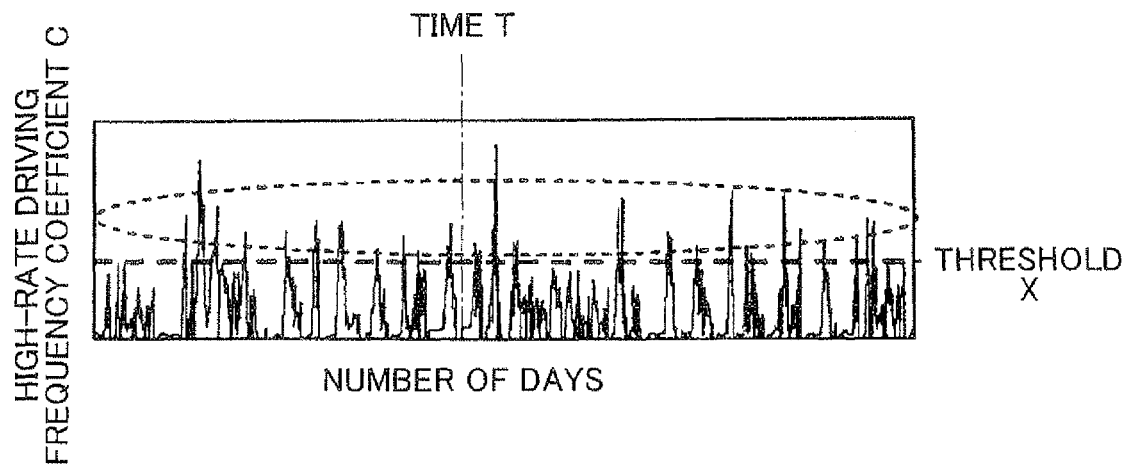
FIG. 7 is a graph that shows a pattern of changes of the high-rate driving frequency coefficient C calculated by the vehicle with a lapse of time.

More specifically, in the example shown in FIG. 7, C exceeds X many times over all the period, and the number of times of excessive C is about sixteen after the predetermined time T. Thus, when changes of the high-rate driving frequency coefficient C have been determined as in the case of the pattern shown in FIG. 7, it is determined that the high-rate driving frequency is high.

Figure 8:
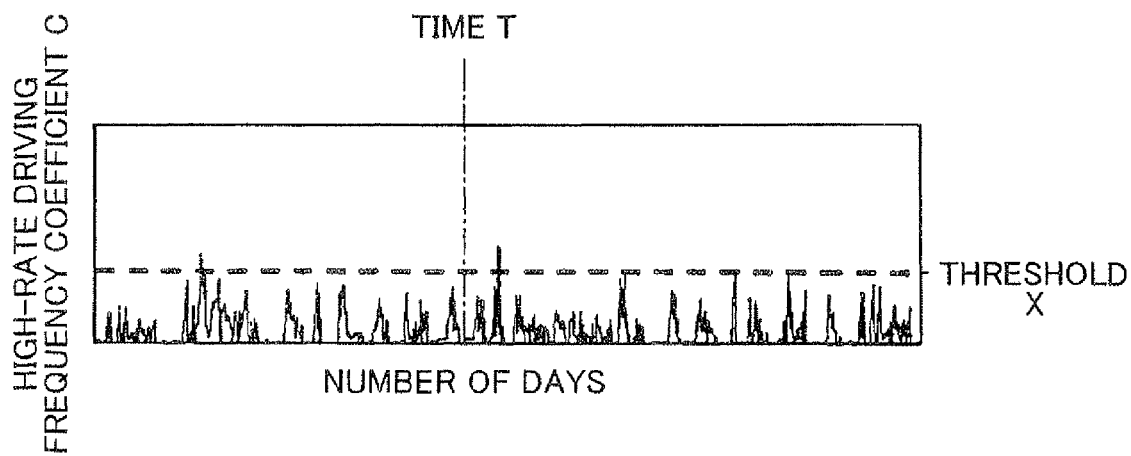
FIG. 8 is a graph that shows another pattern of changes of the high-rate driving frequency coefficient C calculated by the vehicle with a lapse of time.

In contrast to this, in the example shown in FIG. 8, C almost does not exceed X over all the period, and the number of times of excessive C is one after the predetermined time T. Thus, when changes of the high-rate driving frequency coefficient C have been determined as in the case of the pattern shown in FIG. 8, it is determined that the high-rate driving frequency is not high (the high-rate driving frequency is low).

Figure 9:
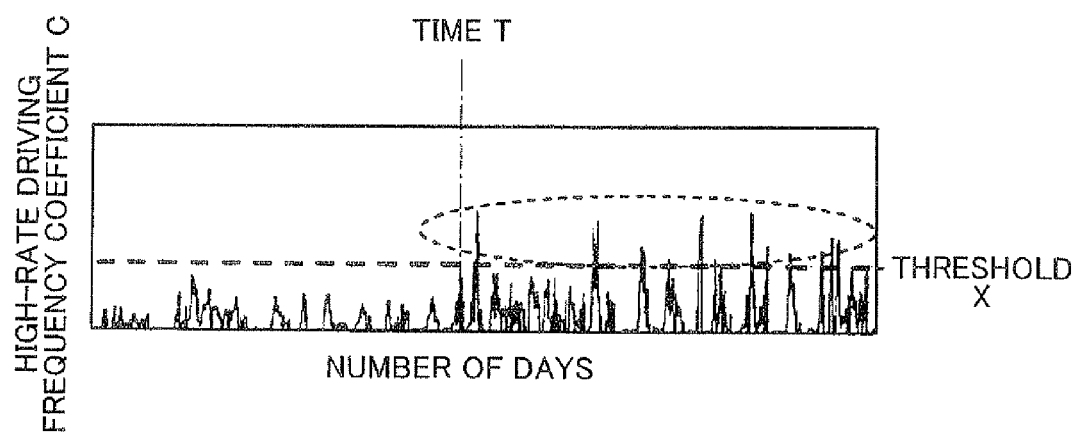
FIG. 9 is a graph that shows further another pattern of changes of the high-rate driving frequency coefficient C calculated by the vehicle with a lapse of time.

On the other hand, in the example shown in FIG. 9, C does not exceed X at all before the time T; whereas C exceeds X eleven times after the time T. Thus, when changes of the high-rate driving frequency coefficient C have been determined as in the case of the pattern shown in FIG. 9, it is determined that the high-rate driving frequency is high.

Figure 10:
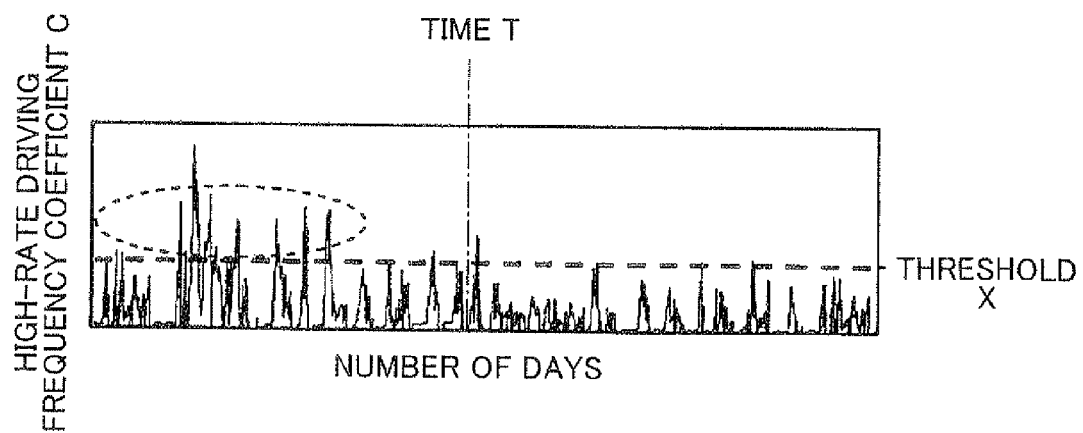
FIG. 10 is a graph that shows yet another pattern of changes of the high-rate driving frequency coefficient C calculated by the vehicle with a lapse of time.

In the example shown in FIG. 10, C exceeds X several times before the time T, and the number of times of excessive C is larger than or equal to ten over all the period; however, the number of times of excessive C is only one after the time T. Thus, when changes of the high-rate driving frequency coefficient C have been determined as in the case of the pattern shown in FIG. 10, it is determined that the high-rate driving frequency is not high (the high-rate driving frequency is low).

When changes of the high-rate driving frequency coefficient C have been determined as in the case of the pattern shown in FIG. 9 or the pattern shown in FIG. 10, it is found that how the vehicle 100 is used has changed before and after the time T. For example, this is the case where a main user of the vehicle 100 has changed or the case where a region in which the vehicle 100 is used has changed. When the region in which the vehicle 100 is used has changed to a low-temperature region, high-rate driving easily occurs, so the number of times of excessive C can increase after the time T as shown in FIG. 9. On the other hand, when the region in which the vehicle 100 is used has changed to a high-temperature region, high-rate driving is hard to occur, so the number of times of excessive C can reduce after the time T as shown in FIG. 10.

The computing unit 120 that has executed step S003 determines whether the high-rate driving frequency is high (S004). When the high-rate driving frequency is high, the computing unit 120 further determines whether the user places importance on acceleration of the vehicle 100 (S005). Information as to whether the user places importance on acceleration of the vehicle 100 is input to the vehicle 100 by operating the input/output unit 140. When the user places importance on acceleration of the vehicle 100, it is determined to replace the battery with a high-power battery (S006). The high-power battery is able to be charged or discharged at a larger current than a standard-grade battery (described later) or a high-capacity battery, and has an excellent large-current characteristic.

On the other hand, when negative determination is made in step S004 or step S005, it is determined whether the user places importance on electric vehicle range (S007). Information as to whether the user places importance on electric vehicle range is input to the vehicle 100 by operating the input/output unit 140. When the user places importance on electric vehicle range, it is determined to replace the battery with a high-capacity battery (S008). Here, the high-capacity battery has a larger energy capacity than a standard-grade battery (described later) or a high-power battery, and is a high-energy-capacity battery. In addition, the electric vehicle range (i.e., distance to empty) is a range in the case where the power of the motor that is an electrical drive source is used as the driving force of the vehicle.

When negative determination is made in step S007, it is determined to replace the battery with a standard-grade battery (S009).

Figure 11:
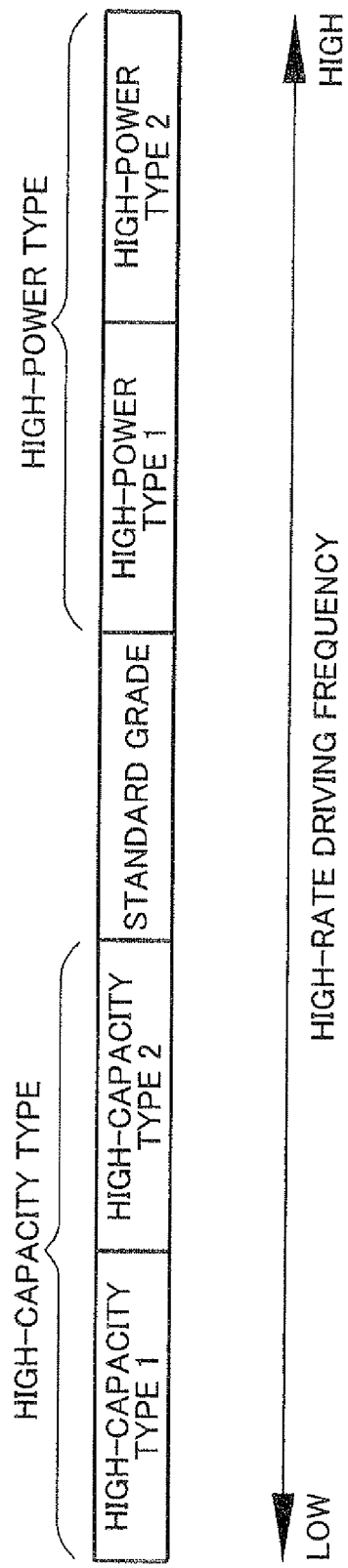
FIG. 11 is a view that shows replacement batteries in association with a high-rate driving frequency by type.

Here, the type of replacement battery will be described. As shown in FIG. 11, there are mainly three types of battery, that is, a high-capacity battery, a high-power battery and a standard-grade battery, as the replacement battery. The high-capacity battery is a battery right for a user of which the high-rate driving frequency is low. The high-power battery is a battery right for a user of which the high-rate driving frequency is high. The high-capacity battery is classified into two types, that is, a high-capacity battery 1 and a high-capacity battery 2. The high-power battery is classified into two types, that is, a high-power battery 1 and a high-power battery 2. When these batteries are arranged in order from the battery right for a user of which the high-rate driving frequency is low, these batteries are arranged in order of the high-capacity battery 1, the high-capacity battery 2, the standard-grade battery, the high-power battery 1, and the high-power battery 2. The high-power battery 2 is a battery right for a user of which the high-rate driving frequency is the highest. The standard-grade battery is a battery having an intermediate characteristic among these batteries. In the embodiment, a user is allowed to select a replacement battery from among these batteries in agreement with a self-usage habit (high-rate driving frequency) and a taste (whether importance is placed on acceleration and whether importance is placed on electric vehicle range).

Figure 12:
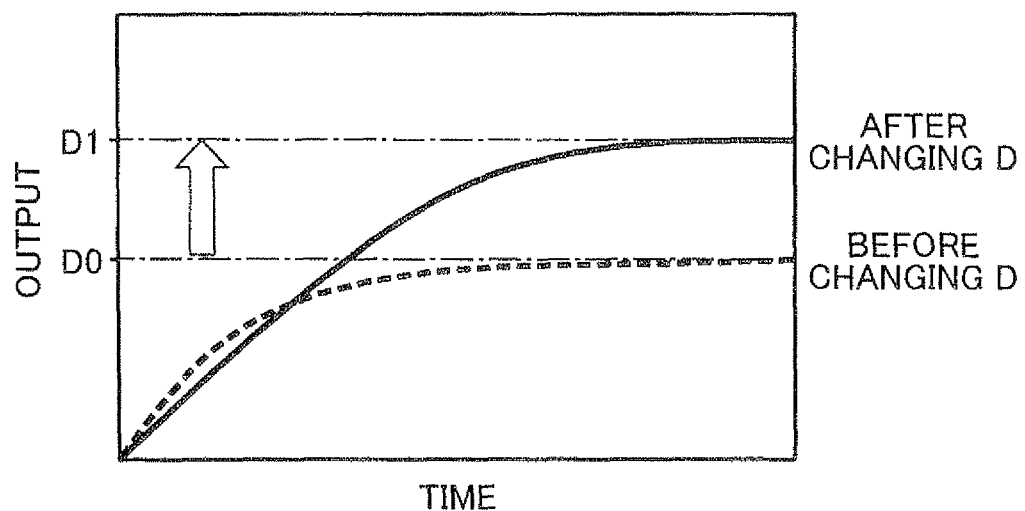
FIG. 12 is a graph that shows an example in which an output control threshold is changed when the battery is replaced with a high-power battery.

After it is determined to replace the battery with the high-power battery in step S006 and then the battery is actually replaced with the high-power battery, the computing unit 120 changes a battery output control threshold D from a current reference value D0 to D1 that is larger than D0 as shown in FIG. 12 (S010), and ends the process. This is to make it hard to activate output control over the battery. Acceleration performance, or the like, improves by making it hard to activate output control over the battery in this way, so it is possible to improve drivability (easiness of driving) for a user of which the high-rate driving frequency is high. In addition, it is possible to improve fuel economy during high-rate driving.

Figure 13:
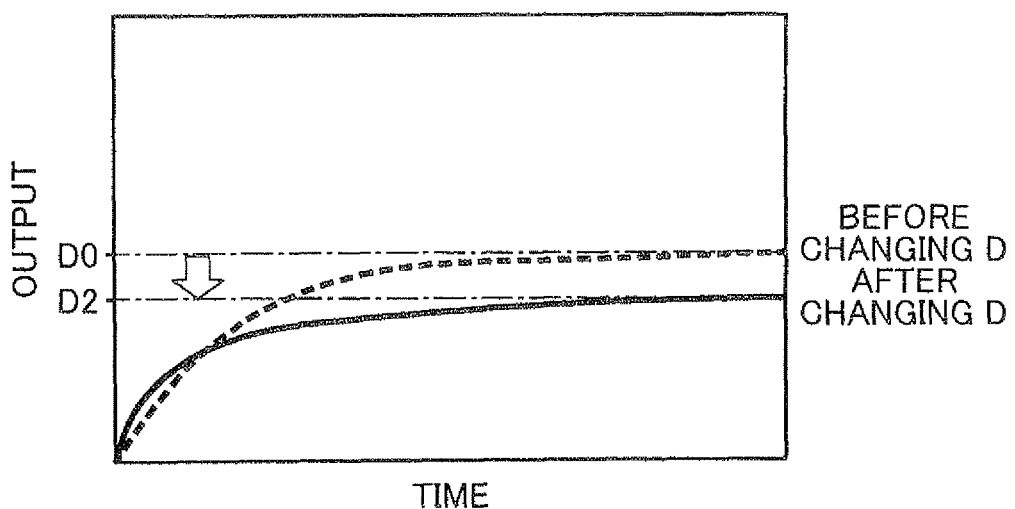
FIG. 13 is a graph that shows an example in which the output control threshold is changed when the battery is replaced with a high-capacity battery.

After it is determined to replace the battery with the high-capacity battery in step S008 and then the battery is actually replaced with the high-capacity battery, the computing unit 120 changes the battery output control threshold D from the current reference value D0 to D2 that is smaller than D0 as shown in FIG. 13 (S011), and ends the process. This is to make it easy to activate output control over the battery. High-rate driving is prevented by making it easy to activate output control over the battery in this way, so it is possible to delay degradation of the battery that is used by a user of which the high-rate driving frequency is not high.

Output control over the battery is executed in the vehicle 100 in order to extend the life of the battery by suppressing degradation of the battery. In output control over the battery, the computing unit 120 controls a converter (not shown) and an inverter (not shown) such that an actual output power of the battery becomes lower than the predetermined output control threshold D.

4. Operation and Advantageous Effects of Embodiment

As described in detail above, the battery management system 1 according to the embodiment includes the measuring unit (surface pressure sensor) 110, a high-rate driving frequency coefficient calculation unit (or a calculation unit) (computing unit 120), a high-rate driving frequency deriving unit (or a deriving unit) (computing unit 120) and a replacement battery selecting unit (or a selecting unit) (computing unit 120). The measuring unit (surface pressure sensor) 110 measures the surface pressure of a vehicle 100-mounted secondary battery (battery cell 13) for driving the vehicle with a lapse of time. The high-rate driving frequency coefficient calculation unit (computing unit 120) calculates the high-rate driving frequency coefficient C, which is an index of the frequency of high-rate driving, on the basis of the surface pressure measured by the measuring unit (surface pressure sensor) 110 at intervals of the predetermined period (24 hours). The high-rate driving frequency deriving unit (computing unit 120) derives whether the high-rate driving frequency is high on the basis of the number of times the high-rate driving frequency coefficient C calculated by the high-rate driving frequency coefficient calculation unit (computing unit 120) has exceeded the predetermined threshold X. The replacement battery selecting unit (computing unit 120) selects a replacement battery from among batteries including a high-power battery on the basis of the high-rate driving frequency derived by the high-rate frequency deriving unit (computing unit 120).

With the battery management system 1 according to the embodiment, at the time of replacement of the battery, a replacement battery is selected on the basis of the high-rate driving frequency. Therefore, when a user frequently performs high-rate driving, the battery just needs to be replaced with a high-power battery suitable for such usage. In this way, with the battery management system 1 according to the embodiment, it is possible to provide a battery right for a user.

The replacement battery may be not only a new battery but also a reused battery (that is, a battery subjected to rebuilding treatment, a battery subjected to reusing treatment or a battery subjected to recycling treatment). The rebuilding treatment is to select reusable battery cells, stacks, and the like, from a battery pack, and then to form a battery pack again by gathering these selected battery cells, stacks, and the like. The reusing treatment is to reuse a battery pack directly. The recycling treatment is to recycle a battery by decomposing the battery.

In addition, in the battery management system 1 according to the embodiment, the high-rate driving frequency coefficient calculation unit (computing unit 120) derives the high-rate driving frequency coefficient C by the above-described mathematical expression (1) by using the number of times A the surface pressure has increased at the time of discharging the secondary battery (battery cell 13) at intervals of the predetermined period (24 hours) and the surface pressure increase amount $\Delta B_n$ (n=1, 2, . . . , A) in each increase in surface pressure. Thus, it is possible to reliably determine the degree, to which high-rate driving is performed in a certain period, on the basis of the high-rate driving frequency coefficient C.

In the battery management system 1 according to the embodiment, the high-rate driving frequency coefficient C is calculated at intervals of 24 hours. Thus, the calculated high-rate driving frequency coefficient C indicates the degree of high-rate driving per day, so it is possible to further determine a difference in how the vehicle is used between a weekday and a day off.

In the battery management system 1 according to the embodiment, the high-rate driving frequency deriving unit (computing unit 120) determines that the high-rate driving frequency is high when the number of times the calculated high-rate driving frequency coefficient C has exceeded the threshold X after the predetermined time T is larger than or equal to the predetermined number of times (ten times), and determines that the high-rate driving frequency is not high when the number of times the calculated high-rate driving frequency coefficient C has exceeded the threshold X after the predetermined time T is smaller than the predetermined number of times (ten times). Thus, even when the high-rate driving frequency coefficient C frequently exceeds the threshold X before the predetermined time T but when the number of times the high-rate driving frequency coefficient C exceeds the threshold X becomes small after the predetermined time T, it is not determined that the high-rate driving frequency C is high (see the pattern shown in FIG. 10). Thus, when how the vehicle 100 is used has changed, for example, when the user of the vehicle 100 has changed, it is possible to derive an accurate high-rate driving frequency based on only how the vehicle 100 is currently used by setting the date of the change as the predetermined time T. In the present embodiment, it is determined that the high-rate driving frequency is high when the number of times the high-rate driving frequency coefficient C calculated after the predetermined time T has exceeded the threshold X is larger than or equal to ten; however, the number of times of excessive C, which is a reference for this determination, may be changed as needed on the basis of the number of days elapsed after the predetermined time T.

In addition, the battery management system 1 according to the embodiment includes the input/output unit 140 that allows input of information as to whether the user places importance on acceleration and information as to whether the user places importance on electric vehicle range, wherein the replacement battery selecting unit (computing unit 120) selects the high-power battery as the replacement battery when the high-rate driving frequency deriving unit (computing unit 120) has determined that the high-rate driving frequency is high (YES in step S004 of FIG. 3) and information that indicates that the user places importance on acceleration has been input by the input/output unit 140 (YES in step S005 of FIG. 3), and selects the high-capacity battery as the replacement battery when the high-rate driving frequency deriving unit (computing unit 120) has determined that the high-rate driving frequency is high (YES in step S004 of FIG. 3) or not high (NO in step S004 of FIG. 3) and information that indicates that the user places importance on electric vehicle range has been input by the input/output unit 140 (YES in step S007 of FIG. 3). In this way, with the battery management system 1 according to the embodiment, the replacement battery is selected in consideration of not only the high-rate driving frequency but also whether the user places importance on acceleration and whether the user places importance on electric vehicle range, so it is possible to provide the replacement battery intended by the user.

In addition, the battery management system 1 according to the embodiment includes an output control unit (computing unit 120) that executes output control over the secondary battery (battery cell 13) such that the output of the secondary battery (battery cell 13) does not become higher than or equal to the predetermined output control threshold D, wherein the output control unit (computing unit 120) sets the output control threshold D to D1 that is larger than the reference value D0 when the replacement battery selecting unit (computing unit 120) selects the high-power battery as the replacement battery (see step S010 of FIG. 3), and sets the output control threshold D to D2 that is smaller than the reference value D0 when the replacement battery selecting unit (computing unit 120) selects the high-capacity battery as the replacement battery (see step S011 of FIG. 3). Thus, when the high-power battery has been selected as the replacement battery, the output control threshold D is increased from D0 to D1, so output control over the battery is hard to be activated. Thus, acceleration performance, or the like, improves, and drivability improves. In addition, fuel economy during high-rate driving also improves. On the other hand, when the high-capacity battery has been selected as the replacement battery, the output control threshold D is reduced from D0 to D2, so output control over the battery is easily activated. Thus, it is possible to appropriately prevent degradation of the battery by suppressing high-rate driving.

5. Alternative Embodiment

The above-described embodiment is only illustrative, and does not intend to limit the invention. Thus, the invention is, of course, variously improved or modified without departing from the scope of the invention. For example, the type of battery is not limited. The battery may be not a lithium ion battery but a nickel metal hydride battery, or may be a battery of another type.

In the embodiment, the interval of time (unit time) of calculation of the high-rate driving frequency coefficient is set to 24 hours; however, the interval of time is freely changeable. However, if the unit time is too long, a coefficient that indicates the frequency of high-rate driving has a low sensitivity, so the unit time is desirably set to about 24 hours to one month.

Figure 14:
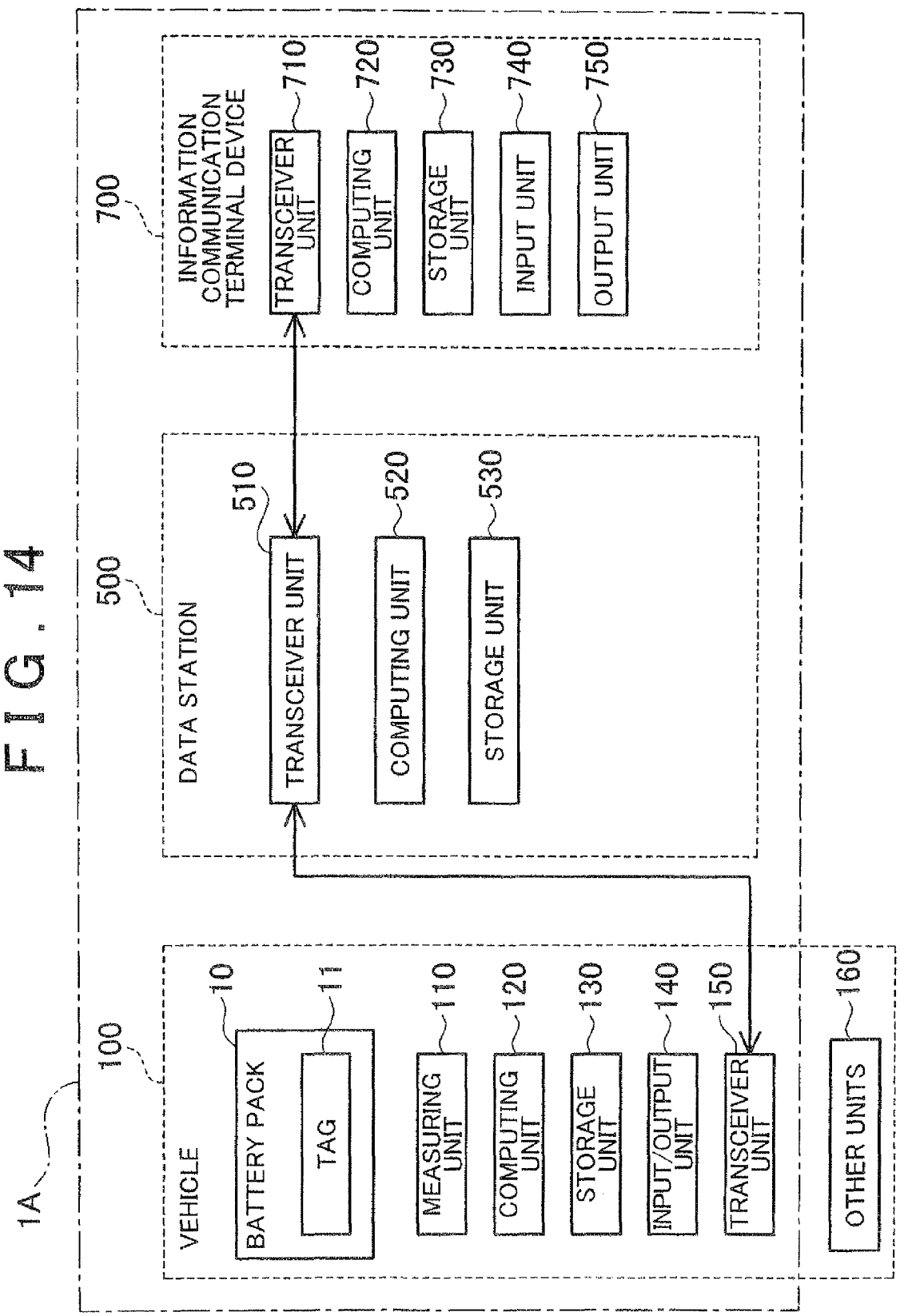
FIG. 14 is a block diagram for illustrating a battery management system according to an alternative embodiment.

In the above-described embodiment, the battery management system 1 includes only the vehicle 100; however, as long as it is possible to select a battery that should be finally provided to a user (battery that is right for a user to be replaced with the battery), the battery management system 1 may have any configuration. For example, as shown in FIG. 14, a battery management system may include the vehicle 100, a data station 500 and an information communication terminal 700.

Hereinafter, the battery management system 1A according to an alternative embodiment will be described with reference to FIG. 14. In the battery management system 1A according to the alternative embodiment shown in FIG. 14, the vehicle 100 includes a transceiver unit 150. The transceiver unit 150 is a portion for carrying out information communication via the Internet network, a cellular phone line network, or the like, with a transceiver unit 510 of the data station 500. The transceiver unit 150 transmits data, stored in the tag 11 or the storage unit 130, to the data station 500 or receives data stored in a storage unit 530 of the data station 500. The other configuration of the vehicle 100 is similar to that of the above-described embodiment.

The data station 500 is a battery information management unit that includes the transceiver unit 510, a computing unit 520 and the storage unit 530. The battery information management unit is located at a remanufacturing base. The remanufacturing base is a place at which used batteries for reuse are gathered.

The transceiver unit 510 is a portion for carrying out information communication with the transceiver unit 150 of the vehicle 100 or with the transceiver unit 710 of the information communication terminal 700. The computing unit 520 includes a CPU. The storage unit 530 is formed of a RAM and a ROM that are additionally provided in the CPU that constitutes the computing unit 520. The storage unit 530 stores data received by the transceiver unit 510 and data computed by the computing unit 520.

The information communication terminal 700 is, for example, a personal computer located at a dealer of the vehicle 100. The information communication terminal 700 includes the transceiver unit 710, a computing unit 720, a storage unit 730, an input unit 740 and an output unit 750. The transceiver unit 710 is a portion for carrying out information communication with the transceiver unit 510 of the data station 500 via the Internet network, or the like. The transceiver unit 710 transmits data stored in the storage unit 730 to the data station 500 or receives data stored in the storage unit 530 of the data station 500.

The computing unit 720 includes a CPU. The storage unit 730 is formed of a RAM and a ROM that are additionally provided in the CPU that constitutes the computing unit 720. The storage unit 730, where necessary, stores data input by the input unit 740, data received by the transceiver unit 710, data computed by the computing unit 720, and the like. The input unit 740 is formed of a known keyboard, a known mouse, or the like. The input unit 740 is operated by an employee of a dealer, a user of the vehicle 100, or the like. The output unit 750 is formed of a known liquid crystal display device, or the like. The output unit 750 outputs information to the employee of the dealer, the user of the vehicle 100, or the like.

In the thus configured battery management system 1A according to the alternative embodiment, the process that is executed by the battery management system 1 according to the embodiment and that is shown in FIG. 3 is shared by the vehicle 100 and the data station 500. Specifically, the vehicle 100 executes step S001 to step S002 and step S010 to step S011 shown in FIG. 3, and the data station 500 executes step S003 to step S009 shown in FIG. 3. In the case of such a configuration, the vehicle 100 transmits the high-rate driving frequency coefficient C calculated in step S002 to the data station 500 together with tag information of the battery. Upon reception of these pieces of information, the data station 500 stores C in the storage unit 530 together with the tag information of the battery. The data station 500 receives information indicating that it is time to replace the battery, information that the user places importance on acceleration of the vehicle 100 or information that the user places importance on electric vehicle range from the information communication terminal 700. By receiving such information, the data station 500 is able to execute step S003 and to determine step S005 and step S007.

With the thus configured battery management system 1A, at the time when the user drives the vehicle to the dealer in order to replace the battery, it is possible to acquire information as to which battery is suitable for a replacement battery by operating the information communication terminal 700. That is, information that the battery will be replaced is input by the input unit 740 of the information communication terminal 700 together with the tag information and information about user's intention (whether the user places importance on acceleration and whether the user places importance on electric vehicle range), and is transmitted to the data station 500. In the data station 500, the replacement battery right for the user is selected on the basis of the received information, the high-rate driving frequency coefficients C stored in the storage unit 530 and the threshold X. The information is transmitted to the information communication terminal 700. In the information communication terminal 700, information about the selected replacement battery, received from the data station 500, is displayed by the output unit 750 to the user, or the like. In this way, with the battery management system 1A shown in FIG. 14, the user, or the like, is allowed to know with which type of battery the battery should be replaced.

In the embodiment, the computing unit 120 of the vehicle 100 constitutes the high-rate driving frequency coefficient calculation unit, the high-rate driving frequency deriving unit, the replacement battery selecting unit and the output control unit. However, in the alternative embodiment shown in FIG. 14, the computing unit 120 of the vehicle 100 constitutes the high-rate driving frequency coefficient calculation unit and the output control unit, and the computing unit 520 of the data station 500 constitutes the high-rate driving frequency deriving unit and the replacement battery selecting unit.

What is claimed is:

1. A battery management system comprising:
    a surface pressure sensor configured to measure a surface pressure of a vehicle-mounted secondary battery for driving a vehicle with a lapse of time; and
    a computing unit configured to:
        (i) calculate a high-rate driving frequency coefficient at intervals of a predetermined period based on the surface pressure measured by the surface pressure sensor, the high-rate driving frequency coefficient being an index of a frequency of high-rate driving;
        (ii) derive a high-rate driving frequency based on a number of times that the calculated high-rate driving frequency coefficient has exceeded a predetermined threshold; and
        (iii) select a replacement battery from among batteries including a high-power battery based on the derived high-rate driving frequency.

2. The battery management system according to claim 1, wherein the computing unit is configured to calculate the high-rate driving frequency coefficient by $$c = \sum_{n=1}^{A} \Delta B_n$$

at the intervals of the predetermined period where A is a number of times the surface pressure has increased at a time of discharging the secondary battery, $\Delta B_n$ (n=1, 2, ..., A) is a surface pressure increase amount at each increase in surface pressure and C is the high-rate driving frequency coefficient.

3. The battery management system according to claim 2, wherein the predetermined period is 24 hours.

4. The battery management system according to claim 1, wherein
    the computing unit is configured to determine that the high-rate driving frequency is high when the number of times that the high-rate driving frequency coefficient calculated after a predetermined time has exceeded the threshold is larger than or equal to a predetermined number of times, and
    the computing unit is configured to determine that the high-rate driving frequency is low when the number of times that the high-rate driving frequency coefficient calculated after the predetermined time has exceeded the threshold is smaller than the predetermined number of times.

5. The battery management system according to claim 4, further comprising:
    an input unit configured to allow input of information as to whether a user places importance on acceleration and information as to whether the user places importance on electric vehicle range that the vehicle travels only using a power of a motor, wherein
    the computing unit is configured to select the high-power battery as the replacement battery when the computing unit has determined that the high-rate driving frequency is high and when the information that the user places importance on acceleration has been input by the input unit, and
    the computing unit is configured to select a high-capacity battery as the replacement battery when the computing unit has determined that the high-rate driving frequency is high or low and when the information that the user places importance on the electric vehicle range has been input by the input unit.

6. The battery management system according to claim 5, further comprising:
an output control unit configured to execute output control over the secondary battery such that an output of the secondary battery is lower than a predetermined output control threshold, wherein
the output control unit is configured to increase the output control threshold with respect to a reference value when the computing unit has selected the high-power battery as the replacement battery, and
the output control unit is configured to reduce the output control threshold with respect to the reference value when the computing unit has selected the high-capacity battery as the replacement battery.

7. A battery replacement method comprising:
measuring, with a surface pressure sensor, a surface pressure of a vehicle-mounted secondary battery for driving a vehicle with a lapse of time;
calculating, with a computing unit, a high-rate driving frequency coefficient at intervals of a predetermined period based on the measured surface pressure, the high-rate driving frequency coefficient being an index of a frequency of high-rate driving;
deriving, with the computing unit, a high-rate driving frequency based on a number of times that the calculated high-rate driving frequency coefficient has exceeded a predetermined threshold; and
selecting, with the computing unit, a replacement battery from among batteries including a high-power battery based on the derived high-rate driving frequency.

8. The battery replacement method according to claim 7, wherein the high-rate driving frequency coefficient is calculated by $$c = \sum_{n=1}^{A} \Delta B_n$$

at the intervals of the predetermined period where A is a number of times the surface pressure has increased at a time of discharging the secondary battery, $\Delta B_n$ (n=1, 2, ..., A) is a surface pressure increase amount at each increase in surface pressure and C is the high-rate driving frequency coefficient.

9. The battery replacement method according to claim 8, wherein the predetermined period is 24 hours.

10. The battery replacement method according to claim 7, wherein
the high-rate driving frequency is determined to be high when the number of times that the high-rate driving frequency coefficient calculated after a predetermined time has exceeded the threshold is larger than or equal to a predetermined number of times, and
the high-rate driving frequency is determined to be low when the number of times that the high-rate driving frequency coefficient calculated after the predetermined time has exceeded the threshold is smaller than the predetermined number of times.

11. The battery replacement method according to claim 10, further comprising:
inputting information as to whether a user places importance on acceleration and information as to whether the user places importance on electric vehicle range that the vehicle travels only using a power of a motor, wherein
the high-power battery is selected as the replacement battery when the high-rate driving frequency is determined to be high and when the input information indicates that the user places importance on acceleration, and
a high-capacity battery is selected as the replacement battery when the high-rate driving frequency is determined to be high or low and when the input information indicates that the user places importance on the electric vehicle range.

12. The battery replacement method according to claim 11, further comprising:
executing output control over the secondary battery such that an output of the secondary battery is lower than a predetermined output control threshold, wherein
the output control threshold is increased with respect to a reference value when the high-power battery has been selected as the replacement battery, and
the output control threshold is reduced with respect to the reference value when the high-capacity battery has been selected as the replacement battery.

* * * * *